(12) United States Patent
Furuta et al.

(10) Patent No.: US 8,471,336 B2
(45) Date of Patent: Jun. 25, 2013

(54) SEMICONDUCTOR INTEGRATED CIRCUIT INCLUDING TRANSISTOR HAVING DIFFUSION LAYER FORMED AT OUTSIDE OF ELEMENT ISOLATION REGION FOR PREVENTING SOFT ERROR

(75) Inventors: Hiroshi Furuta, Kanagawa (JP); Shouzou Uchida, Kanagawa (JP); Muneaki Matsushige, Kanagawa (JP); Junji Monden, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/437,311

(22) Filed: Apr. 2, 2012

(65) Prior Publication Data

US 2012/0241860 A1    Sep. 27, 2012

Related U.S. Application Data

(62) Division of application No. 12/453,178, filed on Apr. 30, 2009, now Pat. No. 8,169,037.

(30) Foreign Application Priority Data

May 22, 2008   (JP) .................................. 2008-134095
Apr. 10, 2009  (JP) .................................. 2009-096373

(51) Int. Cl.
*H01L 29/76*         (2006.01)
(52) U.S. Cl.
USPC ............................ 257/338; 257/355; 257/394
(58) Field of Classification Search
USPC ....................... 257/355, 394, E29.255, 338
See application file for complete search history.

(56) References Cited

U.S. PATENT DOCUMENTS

| | | | |
|---|---|---|---|
| 6,346,475 B1 * | 2/2002 | Suzuki et al. | 438/637 |
| 6,909,135 B2 | 6/2005 | Nii et al. | |
| 7,906,811 B2 * | 3/2011 | Otake | 257/355 |
| 2002/0175359 A1 | 11/2002 | Nii et al. | |
| 2003/0227059 A1 | 12/2003 | Miyake et al. | |

(Continued)

FOREIGN PATENT DOCUMENTS

JP              2002-353413 A      12/2002

OTHER PUBLICATIONS

Eiji Takeda, et al. "A Cross Section of a-Particle-Induced Soft-Error Phenomena in VLSI's" IEEE Transaction on Electron Devices, vol. 36, No. 11, pp. 2567-2575, 1989.

*Primary Examiner* — Phuc Dang
(74) *Attorney, Agent, or Firm* — McGinn IP Law Group, PLLC

(57) ABSTRACT

A semiconductor integrated circuit device includes a gate electrode of at least one of a P-channel MISFET (metal-insulator-semiconductor field-effect transistor) and an N-channel MISFET provided in a direction parallel to a direction of a well isolation boundary phase between the P-channel MISFET and the N-channel MISFET, a first diffusion layer having a same conductivity type as that of a drain diffusion layer of one of a plurality of ones of the MISFET provided in two regions with a drain diffusion layer of the MISFET therebetween through an isolation respectively in a direction orthogonal to the gate electrode, and a second diffusion layer having a conductivity type different from that of the drain diffusion layer of the one of the plurality of ones of the MISFET provided between the well isolation boundary phase and one of a source diffusion layer and the drain diffusion layer.

7 Claims, 13 Drawing Sheets

U.S. PATENT DOCUMENTS

| | | | |
|---|---|---|---|
| 2005/0230736 A1* | 10/2005 | Ishimaru et al. | 257/314 |
| 2005/0269601 A1 | 12/2005 | Tsubaki | |
| 2006/0273355 A1 | 12/2006 | Han | |
| 2008/0099857 A1* | 5/2008 | Furuta et al. | 257/401 |

* cited by examiner

SEMICONDUCTOR INTEGRATED CIRCUIT INCLUDING TRANSISTOR HAVING DIFFUSION LAYER FORMED AT OUTSIDE OF ELEMENT ISOLATION REGION FOR PREVENTING SOFT ERROR

INCORPORATION BY REFERENCE

The present application is a Divisional Application of U.S. patent application Ser. No. 12/453,178, filed on Apr. 30, 2009, now U.S. Pat. No. 8,169,037 B2, which is based on and claims priority from Japanese patent application Nos. 2008-134095 and 2009-096373, filed on May 22, 2008 and Apr. 10, 2009, respectively, the entire contents of which are incorporated herein by reference.

BACKGROUND OF THE INVENTION

1. Field of the Invention

The present invention relates to a semiconductor integrated circuit, and more particularly to a semiconductor integrated circuit capable of suppressing effectively occurrence of soft-errors that might otherwise occur frequently.

2. Description of Related Art

Along with the progress of the semiconductor techniques for miniaturizing elements and lowering their operation voltages, there have appeared semiconductor integrated circuits having been improved more in integration. As a result, the functions and performances of those improved semiconductor integrated circuits have also been enhanced, thereby the number of logic circuits integrated in those circuits is increasing.

In case of a semiconductor integrated circuit including many logic circuits, soft-errors caused by radiation have now come to arise not only in memory cells, but also in logic circuits. This problem is closed up recently. For example, such soft-errors that arise in logic circuits are inversion errors and SET (Single Event Transient) errors. An inversion error occurs, for example, in a circuit that holds information temporarily (information holding circuit) such as a flip-flop (F/F) circuit, a latch circuit, a register circuit, so that the held information is inverted. A SET error occurs as follows. When neutron rays are injected into a transistor of a logic gate of an LSI to generate charge, the operation characteristics of the logic gate are changed in a transient state. Then, the change is transmitted into the LSI, thereby the LSI comes to malfunction.

There is a well-known technique capable of suppressing occurrence of such soft-errors by improving the object circuit configuration. For example, in order to avoid inversion errors, one of such well-known techniques prevents soft-errors by adding a circuit capable of preventing information inversion in the information holding circuit (transistors and capacitance elements are added) to the object LSI. On the other hand, there are well-known techniques related to coincidence circuits and majority-decision circuits, which can be employed to prevent SET errors.

There is also another well-known technique capable of suppressing occurrence of soft-errors by employing inventive layouts and manufacturing processes of such transistors as the MISFET (Metal-Insulator-Semiconductor Field Effect Transistor). For example, one of such well-known methods prevents invasion of charge generated by radiation into the drain (node) diffusion layer of the object MISFET (to reduce the amount of charge to be collected into the layer) (e.g., patent document 1 and non-patent document 1). There is still another well-known method that adjusts the impurity profile in the object substrate to prevent occurrence of soft-errors by employing inventive manufacturing processes.

The patent document 1 (Japanese Patent Application Laid Open No. 2002-353413) discloses a technique that provides a diffusion layer for collecting charge near the object MISFET of a memory cell. According to the technique disclosed in the patent document 1, the diffusion layer has the same conductivity type as that of the diffusion layer of the MISFET of an SRAM cell or F/F circuit and this newly provided diffusion layer suppresses the invasion of charge into the cell node.

The non-patent document 1 discloses a technique related to a relationship between collection of charge generated by radiation into a target diffusion layer (e.g., memory node diffusion layer) and the distance between an adjacent diffusion layer and the target diffusion layer. This non-patent document 1 describes that the longer the distance from the adjacent diffusion layer is, the more the amount of collected charge is reduced (the effective funneling length is reduced).

[Non-patent document 1] Eiji Takeda, et al., "A Cross Section of α-Particle-Induced Soft-Error Phenomena in VLSI's" IEEE TRANSACTION ON ELECTRON DEVICES, VOL. 36, NO. 11, pp. 2567-2575, 1989

SUMMARY

Electric charge is generated by radiation directly/indirectly at random in three-dimensional directions. If there are many diffusion layers disposed around a target diffusion layer so as to collect charge and suppress occurrence of soft-errors that might be caused by those charge just like the technique disclosed in the patent document 1 and the non-patent document 1, then the disposition of those diffusion layers might cause a latch-up phenomenon.

For example, if an N-type diffusion layer is disposed near an NMISFET and a supply voltage is supplied to the N-type diffusion layer or if a P-type diffusion layer is disposed near a PMISFET and a GND voltage is supplied to the P-type diffusion layer, then the disposition can be a trigger source of such a latch-up phenomenon.

Furthermore, if the GND voltage is supplied to the N-type diffusion layer disposed near an NMISFET or if the supply voltage is supplied to a P-type diffusion layer disposed near a PMISFET, then the disposition can cause a parasitic NPN element to function as an emitter in the latch-up state (a PNPN element including a parasitic PNP element and a parasitic NPN element is turned on).

Furthermore, if a diffusion layer having the same conductivity type as that of the object MISFET is disposed near a PN isolation plane, then the disposition can raise the possibility of latch-up occurrence.

A MISFET includes a first conductivity type drain diffusion layer, a source diffusion layer, a gate electrode, and a second conductivity type substrate/well. The second conductivity type is the opposite of the first conductivity type. In the MISFET, first diffusion layers and having the first conductivity type are provided at two or more positions at predetermined intervals with an isolation therebetween respectively. The two or more positions are facing at least two sides of the element isolation insulation surface around the drain diffusion layer. And the second diffusion layer having the second conductivity type is provided so as to be close to or to come in contact with the source diffusion layer.

The semiconductor integrated circuit has measures for preventing soft-errors that might otherwise occur in logic circuits, each of which is constituted by MISFETs. The charge generated in the substrate by radiation near an MISFET are prevented from being collected in the drain diffusion layer of the NMISFET.

The semiconductor integrated circuit may include diffusion layers for collecting charge in a plurality of directions, thereby soft-errors can be prevented from occurrence more effectively than a case in which the charge collecting diffusion layer is provided only in one direction.

Such charge collecting diffusion layers can also suppress occurrence of the latch-up phenomenon.

Furthermore, the semiconductor integrated circuit may provide such charge collecting diffusion layers without losing the symmetry among them. Consequently, the technique can constitute circuits that require such symmetry (e.g., a differential circuit) properly.

In addition to the latch-up problem, there are also MISFET problems that cannot be solved only by providing such charge collecting diffusion layers; one of such problems is that the substrate potential/well potential diffusion layer is separated farther from the MISFET source diffusion layer, thereby the MISFET operation might usually become unstable. In case of the semiconductor integrated circuit of the present invention, the substrate potential/well potential diffusion layer provided closely to or so as to come in contact with the target source diffusion layer can prevent such problems.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
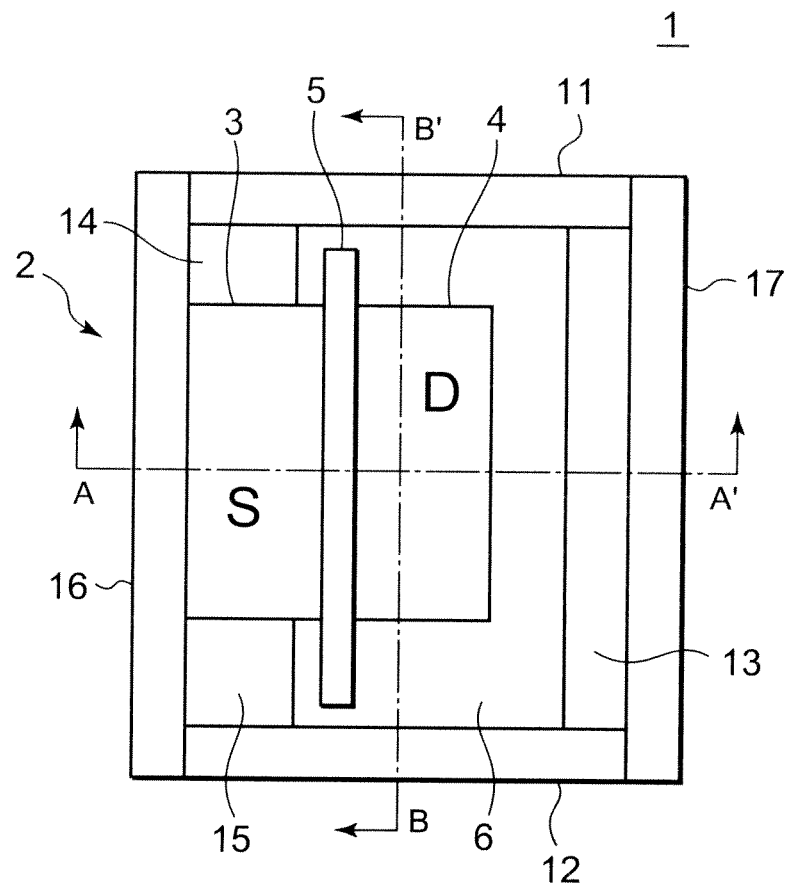
FIG. 1 is a top view of a semiconductor integrated circuit 1 according to a first exemplary embodiment.

FIG. 1 is a top view of a semiconductor integrated circuit 1 according to a first exemplary embodiment of the present invention. In FIG. 1, wirings connected to diffusion layers, wirings connected to gate electrodes, or contacts (Vias), etc. provided between those wirings and diffusion layers are not shown. The semiconductor integrated circuit device 1 includes a plurality of transistors. Hereunder, however, the description will be made merely for one transistor (denoted by a reference numeral 2 in FIG. 1) so as to make it easier to understand the present invention.

As shown in FIG. 1, the transistor 2 used in the semiconductor integrated circuit 1 is an MISFET (Metal-Insulator-Semiconductor Field Effect Transistor), which includes a source diffusion layer 3, a drain diffusion layer 4, and a gate electrode 5. The drain diffusion layer 4 of the transistor 2 is adjacent to an isolation 6. Around the transistor 2 that includes the drain diffusion layer 4 are provided a first charge collecting diffusion layer 11, a second charge collecting diffusion layer 12, a third charge collecting diffusion layer 13, a fourth charge collecting diffusion layer 14, and a fifth charge collecting diffusion layer 15. Those diffusion layers 11 to 15 have the same conductivity type as that of the drain diffusion layer respectively. Adjacent to the source diffusion layer 3 of the transistor 2 is formed a diffusion layer 16 of which conductivity type is different from that of the source/drain diffusion layer (hereinafter, this diffusion layer 16 will be referred to as a first latch-up suppressing diffusion layer 16). Furthermore, adjacent to the third charge collecting diffusion layer 13 is formed a diffusion layer 17 of which conductivity type is different from that of the source/drain diffusion layer (hereinafter, this diffusion layer 17 will be referred to as a second latch-up suppressing diffusion layer 17).

For example, the transistor 2 is an N-channel MISFET (hereinafter, to be described as an NMISFET), the first to fifth charge collecting diffusion layers 11 to 15 are formed as N-type diffusion layers respectively. At this time, each of the first and second to latch-up suppressing diffusion layers 16 and 17 is formed as a P-type diffusion layer. And the isolation 6 comes to insulate the first charge collecting diffusion layer 11 from the drain diffusion layer 4 electrically. The isolation 6 comes to insulate the drain diffusion layer 4 from the second charge collecting diffusion layer 12 electrically. Furthermore, the isolation 6 comes to insulate the drain diffusion layer 4 from the third charge collecting diffusion layer 13 electrically. The fourth charge collecting diffusion layer 14 connects the first charge collecting diffusion layer 11 to the source diffusion layer 3. The fifth charge collecting diffusion layer 15 connects the second charge collecting diffusion layer 12 to the source diffusion layer 3.

In such a way, the drain diffusion layer 4 of the transistor 2 is surrounded by the same conductivity type diffusion layers including the source diffusion layer.

Figure 2:
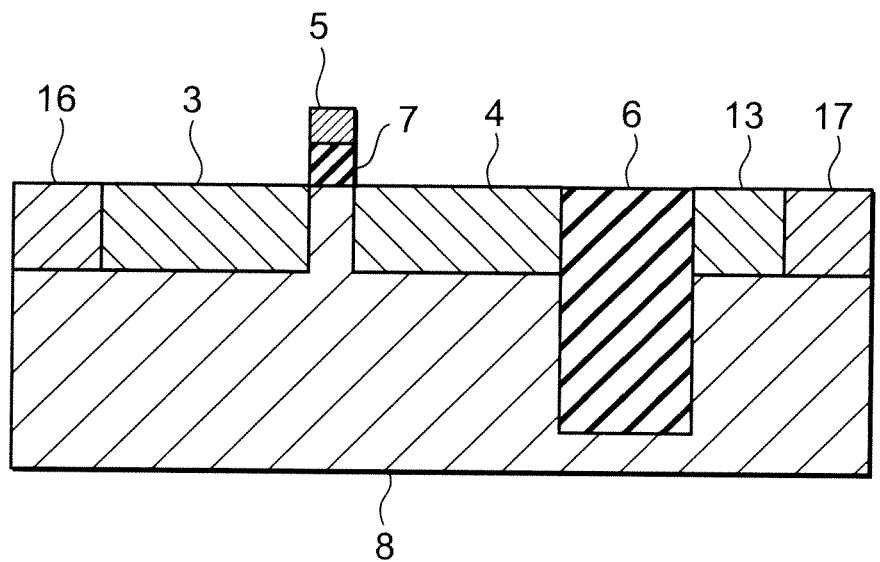
FIG. 2 is a cross sectional view of a transistor 2.

FIG. 2 is an explanatory cross sectional view of the transistor 2 taken on line A-A' of FIG. 1. As shown in FIG. 2, the transistor 2 includes a gate insulation film 7. The gate insulation film 7 is provided between a gate electrode 5 and a P-type substrate 8. The P-type substrate 8 has a conductivity type different from that of the source diffusion layers 3 and 4.

A channel region is provided between the source diffusion layer 3 and the drain diffusion layer 4.

Figure 3:
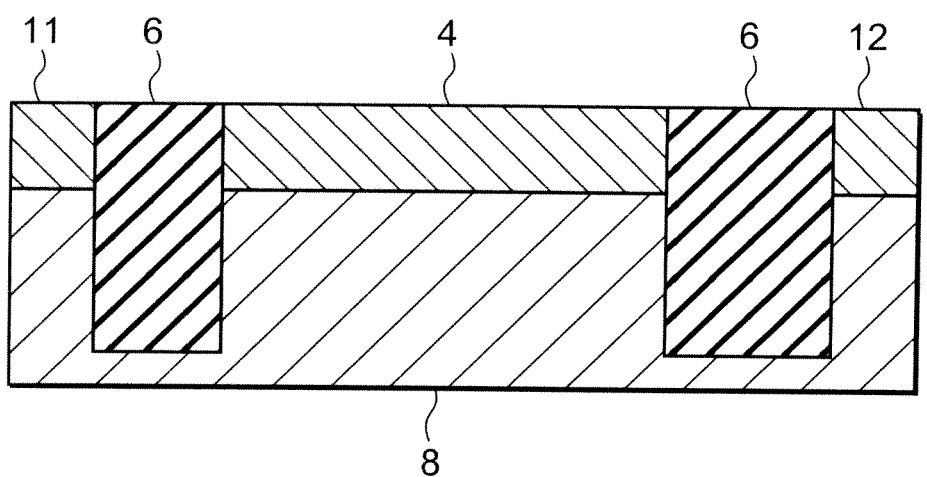
FIG. 3 is another cross sectional view of the transistor 2.

FIG. 3 is an explanatory cross sectional view of the transistor 2 taken on line B-B' of FIG. 1. As shown in FIG. 3, the drain diffusion layer 4 is provided between isolations 6. The drain diffusion layer 4 is provided on the P-type substrate 8. The first and second charge collecting diffusion layers 11 and 12 are provided so as to face the drain diffusion layer 4 respectively with the isolation 6 therebetween in a direction vertical to the channel of the transistor 2.

As described above, in, the drain diffusion layer 4 of the transistor 2 is surrounded by the diffusion layers having the same conductivity type as that of the drain diffusion layer 3 with a channel region therebetween and as that of the drain diffusion layer 4 (source diffusion layer 3) with an isolation therebetween respectively.

Some of the charge generated by radiation are collected into the drain diffusion layer 4 (target diffusion layer). At this time, the shorter the distance between the drain diffusion layer 4 (target diffusion layer) and its adjacent diffusion layer (charge collecting diffusion layer) is, the less the charge are collected in the drain diffusion layer 4. This is because the depletion layer of the adjacent diffusion layer can distribute charge and suppress the potential distortion (potential distortion) to be caused by the adjacent diffusion layer effectively.

The transistor 2 disposes a diffusion layer (a charge collecting diffusion layer) of which conductivity type is the same as that of the drain diffusion layer of the MISFET so as to surround the drain diffusion layer 4, thereby some of the charge generated in every direction can be collected into the charge collecting layer. As a result, charge collecting into the drain diffusion layer 4 (target diffusion layer) is suppressed.

Furthermore, the transistor 2 disposes a diffusion layer (first and second latch-up suppressing diffusion layers 16 and 17) having a conductivity type that is the opposite of that of the MISFET near a diffusion layer (third charge collecting diffusion layer 13 and the source diffusion layer 3) having the same conductivity type as that of the MISFET drain diffusion layer. The voltage supplied to the diffusion layer (the first and second latch-up suppressing diffusion layers 16 and 17) is set at the same voltage (substrate voltage and well voltage) as the source voltage. Consequently, occurrence of the latch-up phenomenon can be suppressed.

Furthermore, the transistor 2 makes the source diffusion layer function as a charge collecting diffusion layer. In this configuration, the area of the semiconductor integrated circuit 1 is suppressed from increasing. In this case, it is required that the source diffusion layer is separated from the charge collecting N-type diffusion layer.

For example, in the NMISFET, the voltage of the charge collecting diffusion layer should be a supply voltage, not a GND voltage. If a supply voltage is used for the charge collecting diffusion layer in such a way, then the depletion layer is widened and the potential near the diffusion layer is fixed at the supply voltage, so the potential distortion is reduced at the time of irradiation of radiation (when carrier ions are injected). Consequently, the charge collecting N-type diffusion layer comes to collect more charge.

In this case, the usage of the supply voltage for the carrier collecting N-type diffusion layer comes to cause a parasitic NPN element to be formed. If the potential of the P-substrate (P-well) rises over a certain value with respect to the potential of the source diffusion layer (ground potential) for any reason, then this parasitic NPN element is turned on. As a result, the collector current flows into an N-well, thereby the parasitic PNP element including the P-type source diffusion layer and the N-well-P-type substrate voltage diffusion layer in the PMISFET comes to be turned on. Furthermore, the collector current of this parasitic PNP element flows into the P-substrate, thereby the parasitic NPN element including an N-type diffusion layer in another N-well, a P-substrate, and an NMISFET source diffusion layer is turned on. In such a way, if the power supply potential is set for the charge collecting N-type diffusion layer, then latch-up problems might come to arise more often.

The semiconductor integrated circuit 1 is provided with a P-type diffusion layer (ground voltage) near the source diffusion layer, thereby the latch-up phenomenon that might otherwise occur can be avoided. The same power supply line is used for both the charge collecting N-type diffusion layer and the power supply of the PMISFET, thereby it is almost avoided to generate a difference between the N-well voltage and the voltage of the charge collecting diffusion layer; the difference might otherwise be often generated.

If the ground voltage (source voltage) is used for a charge collecting N-type diffusion layer, then the depletion layer is narrowed and the carrier collecting efficiency is lowered more than when the supply voltage is used for the charge collecting N-type diffusion layer. In case of the devices in these days, however, even when the ground voltage is used for the charge collecting N-type diffusion layer, the charge collecting efficiency is not changed so much due to the highly concentrated impurities and low supply voltage employed for those devices.

Even when no latch-up problems occur, the following problems cannot be avoided. If the parasitic NPN element is turned on due to the charge (positive holes) generated by radiation in the substrate while a parasitic NPN element includes a P-type substrate (P-well) and a ground voltage set charge collecting N-type diffusion layer, then the voltage of the target drain diffusion layer falls. As a result, information inversion and transmission errors come to arise. Even in such a case, the semiconductor integrated circuit 1 can avoid such problems due to the P-type diffusion layer (ground voltage) provided near the source diffusion layer.

Figure 4:
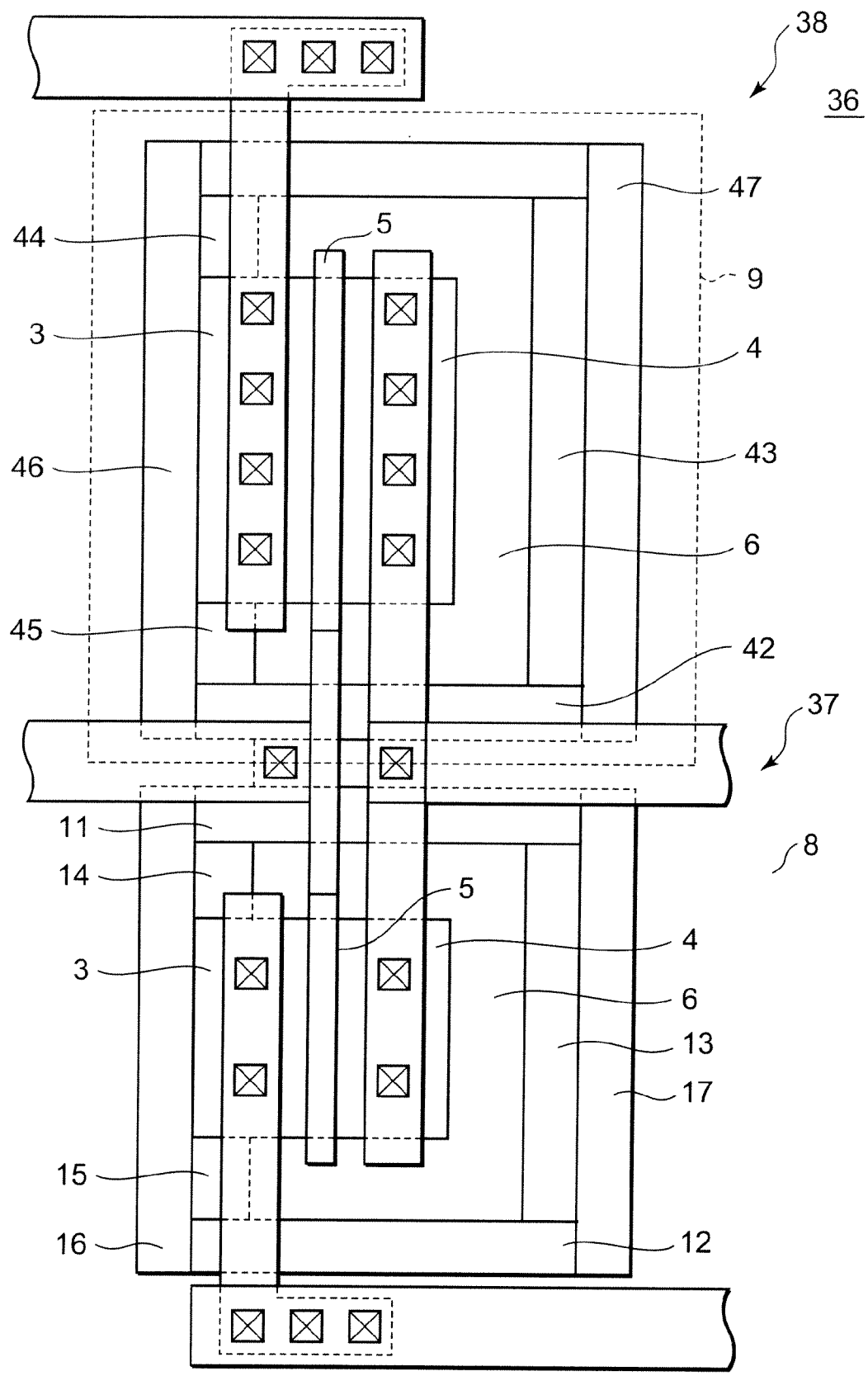
FIG. 4 is a top view of a CMISFET 36.

FIG. 4 is a top view of a CMISFET 36 that includes an N-channel MISFET and a P-channel MISFET. The CMISFET 36 includes an NMISFET 37 and a PMISFET 38. The NMISFET 37 is formed on the P-type substrate 8. The P-type substrate includes an N-well 9 and the PMISFET 38 is formed in the N-well 9.

Around the drain diffusion layer 4 of the NMISFET 37 are formed first to fifth charge collecting diffusion layers 11 to 15. Each of those diffusion layers 11 to 15 has the same conductivity type as that of the drain diffusion layer 4. An isolation 6 is formed between the drain diffusion layer 4 and each of the diffusion layers 11 to 13. The drain diffusion layer 4 and the source diffusion layer 3 are adjacent to each other with a channel region therebetween. Each of the first and second latch-up suppressing diffusion layers 16 and 17 has a conductivity type different from that of the drain diffusion layer 4 (or source diffusion layer 3).

Around the drain diffusion layer 4 of the PMISFET 38 are formed first to fifth charge collecting diffusion layers 41 to 45. Each of those diffusion layers 41 to 45 has the same conductivity type as that of the drain diffusion layer 4. An isolation 6 is formed between the drain diffusion layer 4 and each of the diffusion layers 41 to 43. The drain diffusion layer 4 and the source diffusion layer 3 are adjacent to each other with a channel region therebetween. Each of the first and second latch-up suppressing diffusion layers 16 and 17 has a conductivity type different from that of the drain diffusion layer 4 (or source diffusion layer 3).

As described above, in the CMISFET 36, the NMISFET 37 includes the first and second latch-up suppressing diffusion layers 16 and 17 used to suppress occurrence of the latch-up phenomenon. Similarly, the PMISFET 38 includes the first and second latch-up suppressing diffusion layers 46 and 47 used to suppress occurrence of the latch-up phenomenon. The first and second latch-up suppressing diffusion layers 16 and 17 of the NMISFET 37 are disposed along the gate width direction of the gate electrode 5 (in parallel to the gate electrode). Similarly, the first and second latch-up suppressing diffusion layers 46 and 47 of the PMISFET 38 are disposed along the gate width direction of the gate electrode 5 (in parallel to the gate electrode). The P-type diffusion layer is formed so as to come in contact with the N-type source diffusion layer and the N-type diffusion layer formed near the drain side. Because the N-type diffusion layer and the P-type diffusion layer are in contact with each other in such a way, the layout area can be reduced.

Second Exemplary Embodiment

Figure 5:
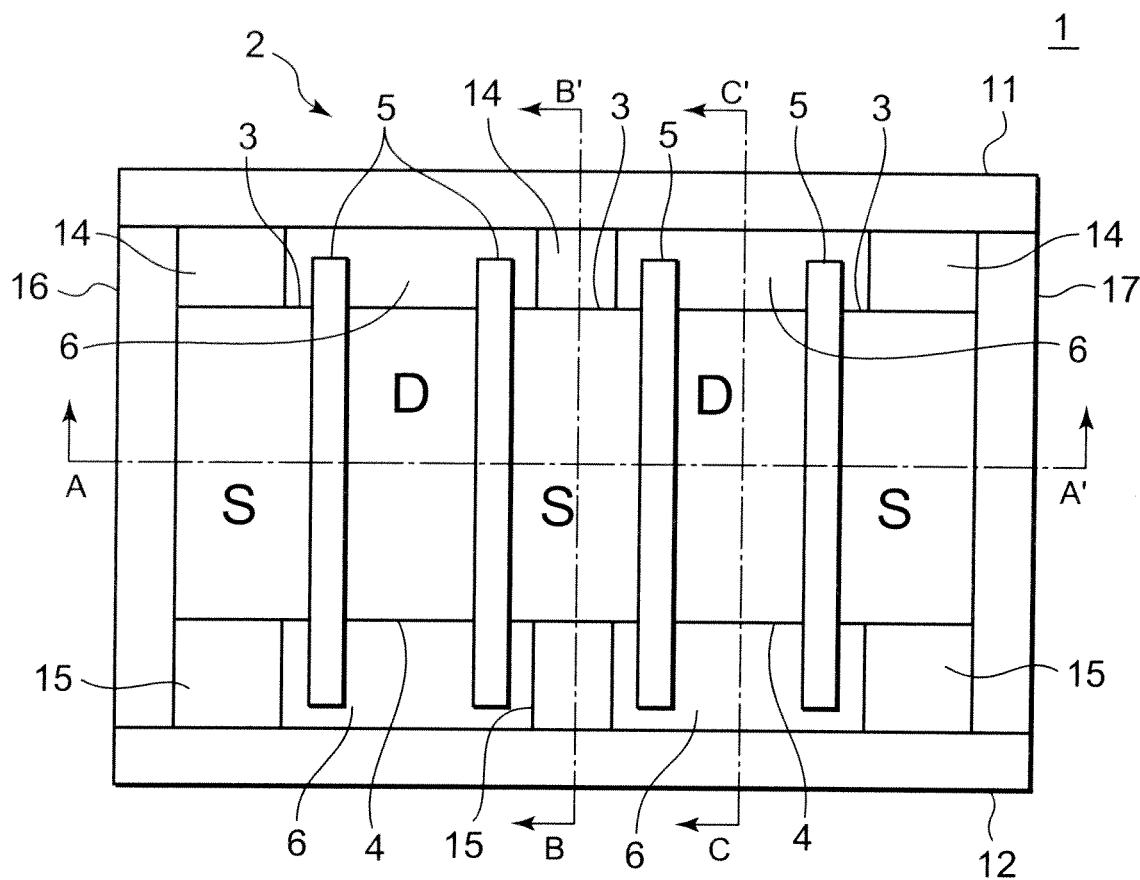
FIG. 5 is a top view of a transistor 2 according to a second exemplary embodiment.

FIG. 5 is a top view of the transistor 2 provided in the semiconductor integrated circuit 1 according to a second exemplary embodiment. The semiconductor integrated circuit 1 includes a transistor 2 provided with four gate electrodes 5. The transistor 2 also includes source diffusion layers 3 and drain diffusion layers 4 that are disposed alternately, as well as gate electrodes 5, each being disposed between a source diffusion layer 3 and a drain diffusion layer 4. Each drain diffusion layer 4 is adjacent to each source diffusion layer 3 with a channel region formed under the gate electrode 5 therebetween. The source diffusion layer 3 is connected to the first charge collecting diffusion layer 11 through the fourth charge collecting diffusion layer 14 and to the second charge collecting diffusion layer 12 through the fifth charge collecting diffusion layer 15 respectively.

Figure 6:
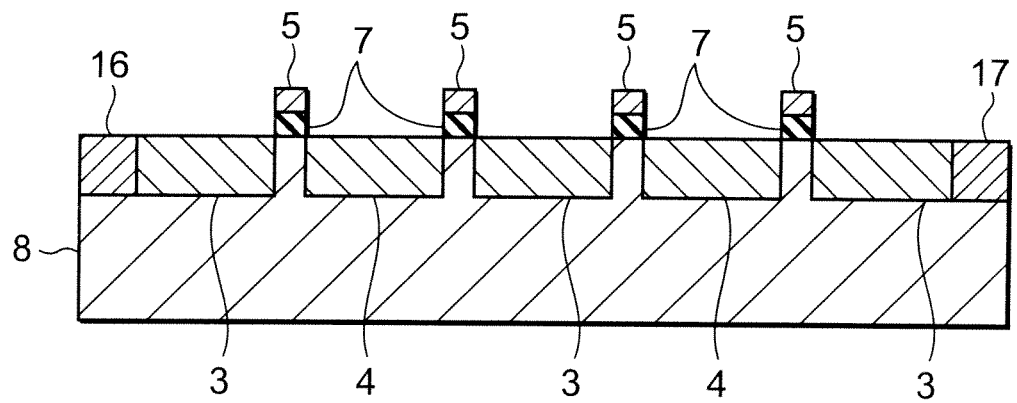
FIG. 6 is a cross sectional view of the transistor according to the second exemplary embodiment.

FIG. 6 is an explanatory cross sectional view of the transistor 2 taken on line A-A' of FIG. 5. As shown in FIG. 6, the transistor 2 provides a gate insulation film 7 between a gate electrode 5 and a channel region of the P-type substrate 8. As described above, the drain diffusion layer 4 of the transistor 2 is disposed between source diffusion layers 3. The source diffusion layer 3 positioned outside is connected to the first or second latch-up suppressing diffusion layer 16 or 17.

Figure 7:
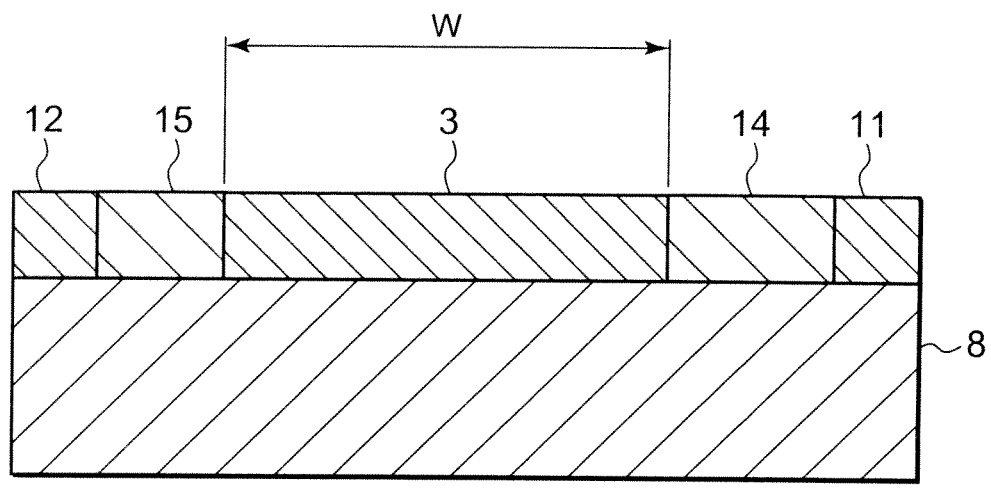
FIG. 7 is another cross sectional view of the transistor according to the second exemplary embodiment.

FIG. 7 is an explanatory cross sectional view of the transistor 2 taken on line B-B' of FIG. 5. As shown in FIG. 7, the source diffusion layer 3 of the transistor 2 is connected to the first charge collecting diffusion layer 11 through the fourth charge collecting diffusion layer 14. The source diffusion layer 3 is connected to the second charge collecting diffusion layer 12 through the fifth charge collecting diffusion layer 15.

Figure 8:
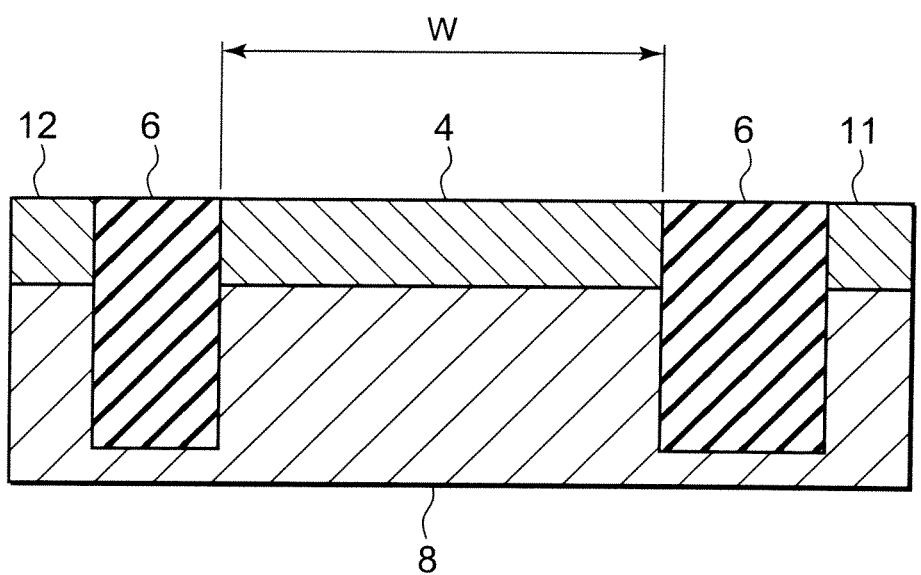
FIG. 8 is still another cross sectional view of the transistor according to the second exemplary embodiment.

FIG. 8 is an explanatory cross sectional view of the transistor 2 taken on line A-A' of FIG. 5. As shown in FIG. 6, in the transistor 2, an isolation 6 is formed between the drain diffusion layer 4 and the first charge collecting diffusion layer 11. The isolation 6 is also formed between the drain diffusion layer 4 and the second charge collecting diffusion layer 12. Consequently, the drain diffusion layer 4 is insulated from the first charge collecting diffusion layer 11 electrically and the drain diffusion layer 4 is insulated from the second charge collecting diffusion layer 12 electrically.

In the transistor 2, diffusion layers that include source diffusion layers and have the same conductivity type respectively are formed so as to surround the drain of the NMISFET, thereby charge collecting in the drain diffusion layer can be suppressed in any directions in which many charge are generated by radiation. Furthermore, the P-type diffusion layer is disposed so as to come in contact with the source diffusion layer, so that occurrence of the latch-up phenomenon can be prevented.

Third Exemplary Embodiment

Figure 9:
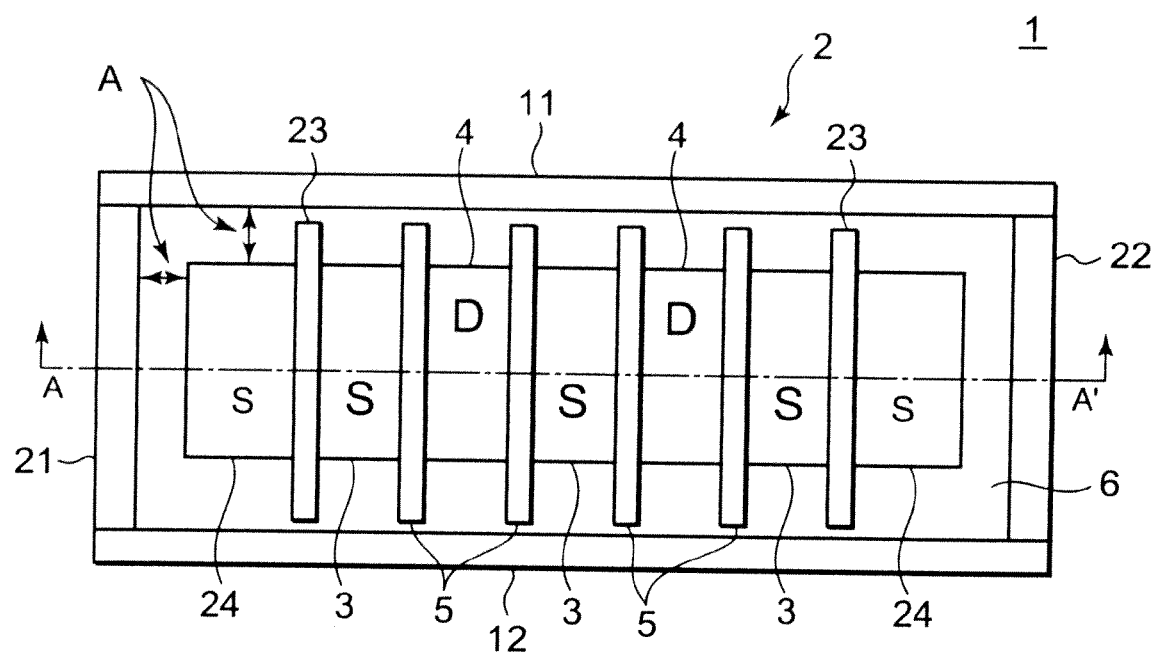
FIG. 9 is a top view of a transistor 2 according to a third exemplary embodiment.

FIG. 9 is a top view of the transistor 2 according to a third exemplary embodiment.

The present invention can apply to the transistor 2, which is further miniaturized. Therefore, there will be described an example of the transistor 2, which is further miniaturized and improved in operation. The transistor 2 is provided with a dummy gate electrode 23 and a dummy source diffusion layer 24 that are not provided in the second exemplary embodiment so as to assure the evenness among the processes of gate electrodes and diffusion layers, as well as to assure an even stress to be applied from the isolation to each diffusion layer. As a result, the electrical characteristics can be matched as much as possible among the elements of the transistor 2. The dummy gate electrode and the dummy source diffusion layer are set at the ground potential beforehand, for example, in an NMISFET region so that they do not function as MISFETs respectively. The transistor 2 is formed first and second charge collecting diffusion layers 11 and 12, well as diffusion layers 21 and 22.

The masking patterns of the transistor 2 that is further miniaturized are standardized in the gate width (W), gate electrode pattern, and gate electrode disposition interval. Furthermore, the transistor 2 is provided with right and left dummy gate electrodes 23. Both ends of a diffusion layer are formed as dummy source diffusion layers 24. The transistor 2 includes four gate electrodes. The two outermost gate electrodes are dummy gate electrodes 23. Those standardized patterns are effective to minimize the characteristic variation of the transistor 2 used in the semiconductor integrated circuit 1.

The first charge collecting diffusion layer 11 provided around the transistor 2 is separated from the source diffusion layer 3. An isolation 6 is provided between the first charge collecting diffusion layer 11 and the source diffusion layer 3. Similarly, the second charge collecting diffusion layer 12 provided around the transistor 2 is separated from the source diffusion layer 3. An isolation 6 is provided between the second charge collecting diffusion layer 12 and the source diffusion layer 3.

In the transistor 2, there is no need to extend the source diffusion layer (or dummy diffusion layer) formed in the standardized pattern. Consequently, the change of the diffusion layer in shape can prevent the change of the diffusion layer in shape and the change of a stress at the boundary phase of the isolation after it is finished while those problems have otherwise occurred. Thus the MISFET can be prevented from characteristic changes.

Interval "A" in FIG. 9 enables the SD diffusion layers and their surrounding diffusion layers of the transistor to be separated so as to avoid the influence of the stress.

Figure 10:
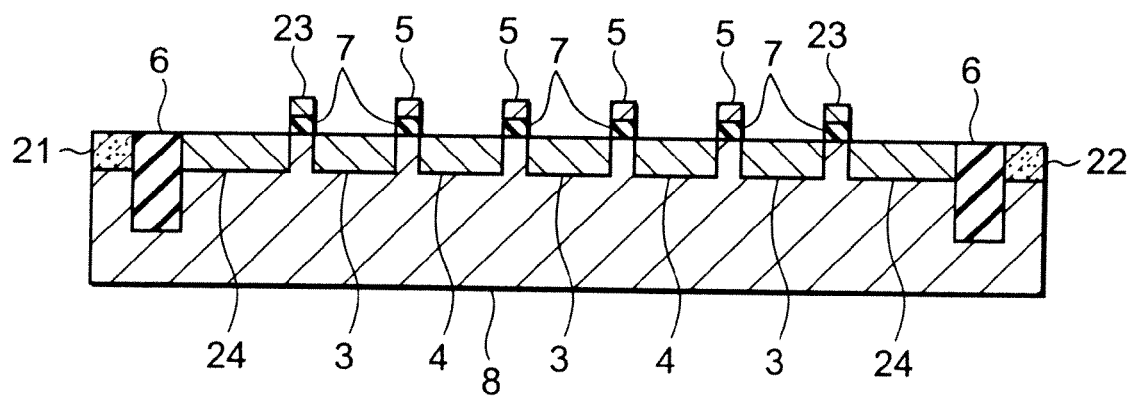
FIG. 10 is a cross sectional view of the transistor 2 according to the third exemplary embodiment.

FIG. 10 is a cross sectional view of the transistor 2 according to the third exemplary embodiment. As shown in FIG. 10, a diffusion layer 21 or 22 is formed outside the dummy source diffusion layer 24 with the isolation 6 therebetween. Any conductivity type can be employed for those diffusion layers 21 and 22. For example, if the diffusion layers 21 and 22 have a conductivity type different from that of the source diffusion layer 3 (or dummy diffusion layer 24), that is, if the dummy source diffusion layer 24 (or source diffusion layer 3) has the N-type and the diffusion layers 21 and 22 are P-type diffusion layers, then the ground voltage is set for both the first and second charge collecting diffusion layers 11 and 12.

If the dummy source diffusion layer 24 (or source diffusion layer 3) is an N-type diffusion layer and the diffusion layers 21 and 22 are also N-type diffusion layers, then any of the ground voltage, the supply voltage, and a voltage between them may be set for both the first and second charge collecting diffusion layers 11 and 12. In this case, a P-type diffusion layer of the ground voltage should preferably be provided outside the diffusion layers 21 and 22 to prevent the latch-up phenomenon.

Fourth Exemplary Embodiment

Figure 11:
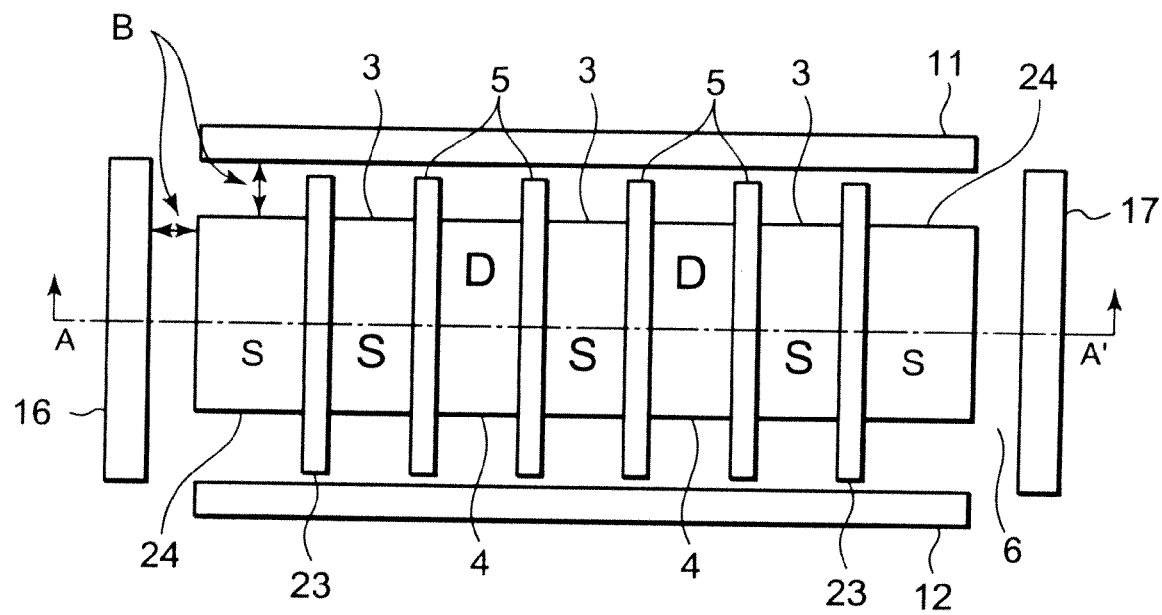
FIG. 11 is a top view of a semiconductor integrated circuit 1 according to a fourth exemplary embodiment.

FIG. 11 is a top view of the semiconductor integrated circuit 1 according to a fourth exemplary embodiment. The semiconductor integrated circuit device 1 includes first charge collecting diffusion layer 11 and second charge collecting diffusion layer 12 around the transistor 2. The first charge collecting diffusion layer 11 and the second charge collecting diffusion layer 12 are extended in a direction at a right angle to the gate width direction. The semiconductor integrated circuit 1 includes a first latch-up suppressing diffusion layer 16 and a second latch-up suppressing diffusion layer 17 around the transistor 2. The conductivity type of the first latch-up suppressing diffusion layer 16 and the second latch-up suppressing diffusion layer 17 is different from that of the dummy source diffusion layer 24 (or source diffusion layer 3).

Interval "B" in FIG. 11 enables the SD diffusion layers and their surrounding diffusion layers of the transistor to be separated so as to avoid the influence of the stress.

Figure 12:
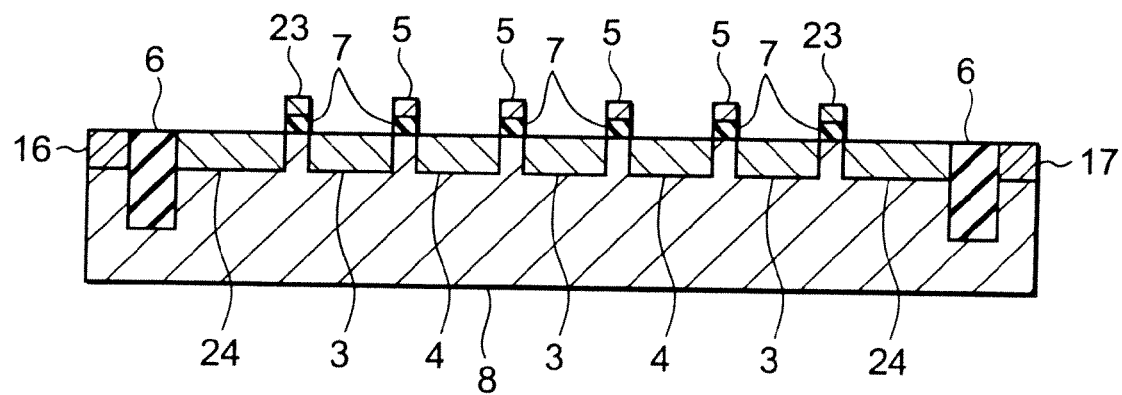
FIG. 12 is a cross sectional view of the transistor 2 according to the fourth exemplary embodiment.

FIG. 12 is an explanatory cross sectional view of the transistor 2, taken on line A-A'. As shown in FIG. 12, in the semiconductor integrated circuit 1, the first latch-up suppressing diffusion layer 16 is adjacent to the dummy source diffusion layer 24 with an isolation 6 therebetween. Similarly, the second latch-up suppressing diffusion layer 17 is adjacent to the dummy source diffusion layer 24 with an isolation 6 therebetween.

The drain diffusion layer 4 of the transistor 2 is surrounded by N-type diffusion layers (the first charge collecting diffusion layer 11, the second charge collecting diffusion layer 12, and the source diffusion layer 3). Concretely, the source diffusion layer 3 (or the dummy source diffusion layer 24) is formed adjacently to the drain diffusion layer 4 with a channel region therebetween and the first charge collecting diffusion layer 11 and the second charge collecting diffusion layer 12 are formed in the gate width direction. Furthermore, the first latch-up suppressing diffusion layer 16 and the second latch-up suppressing diffusion layer 17 are formed near the sources (source diffusion layer 3 and the dummy gate electrode 23). The first latch-up suppressing diffusion layer 16 and the second latch-up suppressing diffusion layer 17 function to suppress occurrence of the latch-up phenomenon. The first charge collecting diffusion layer 11 or the second charge collecting diffusion layer 12 may use any of the supply voltage, the GND voltage, and a voltage between them.

Fifth Exemplary Embodiment

Figure 13:
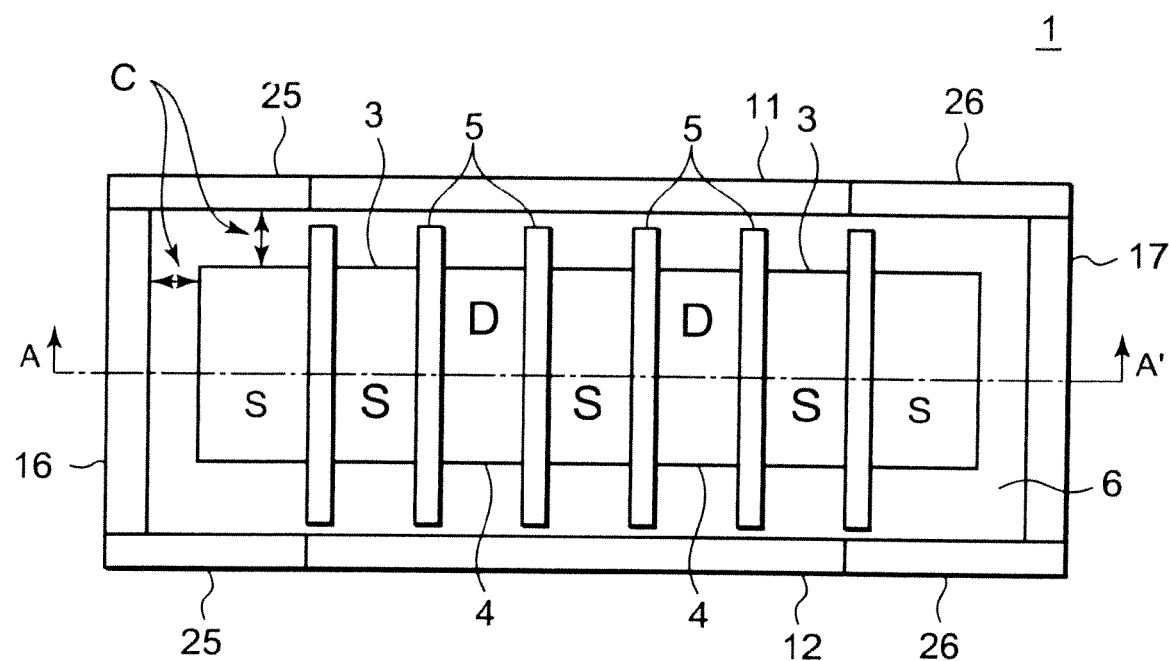
FIG. 13 is a top view of a semiconductor integrated circuit 1 according to a fifth exemplary embodiment.

FIG. 13 is a top view of the semiconductor integrated circuit 1 according to a fifth exemplary embodiment. The semiconductor integrated circuit 1 includes third and fourth latch-up suppressing diffusion layers 25 and 26 in addition to the first and second latch-up suppressing diffusion layers 16 and 17. In other words, the semiconductor integrated circuit 1 forms many P-type diffusion layers around the transistor 2.

Figure 14:
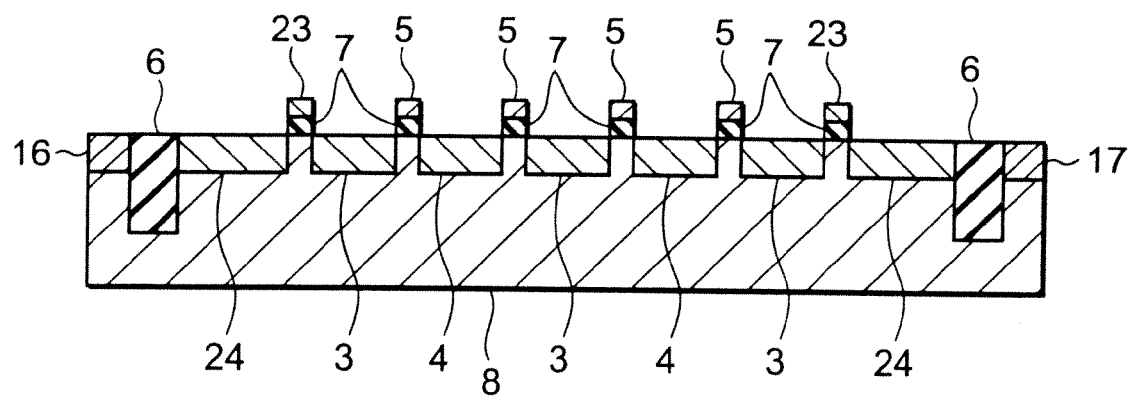
FIG. 14 is a cross sectional view of the semiconductor integrated circuit 1 according to the fifth exemplary embodiment.

FIG. 14 is an explanatory cross sectional view taken on line A-A' of FIG. 13. Similarly to the fourth exemplary embodiment, the first latch-up suppressing diffusion layer 16 is adjacent to the dummy source diffusion layer 24 with an isolation 6 therebetween. The second latch-up suppressing diffusion layer 17 is adjacent to the dummy source diffusion layer 24 with an isolation 6 therebetween.

Interval "C" in FIG. 13 enables the SD diffusion layers and their surrounding diffusion layers of the transistor to be separated so as to avoid the influence of the stress.

In the transistor 2, the source diffusion layer 3 and the dummy source diffusion layer 24 are formed outside the drain diffusion layer. Consequently, the first and second charge collecting diffusion layers 11 and 12, when they are just extended up to the source diffusion layer 3 as shown in FIG. 13, can function sufficiently. As shown in the semiconductor integrated circuit 1, the disposition places of the first and second charge collecting diffusion layers 11 and 12 may be changed as needed to avoid the influence by radiation from the oblique direction at a view from the drain diffusion layer 4.

Sixth Exemplary Embodiment

Figure 15:
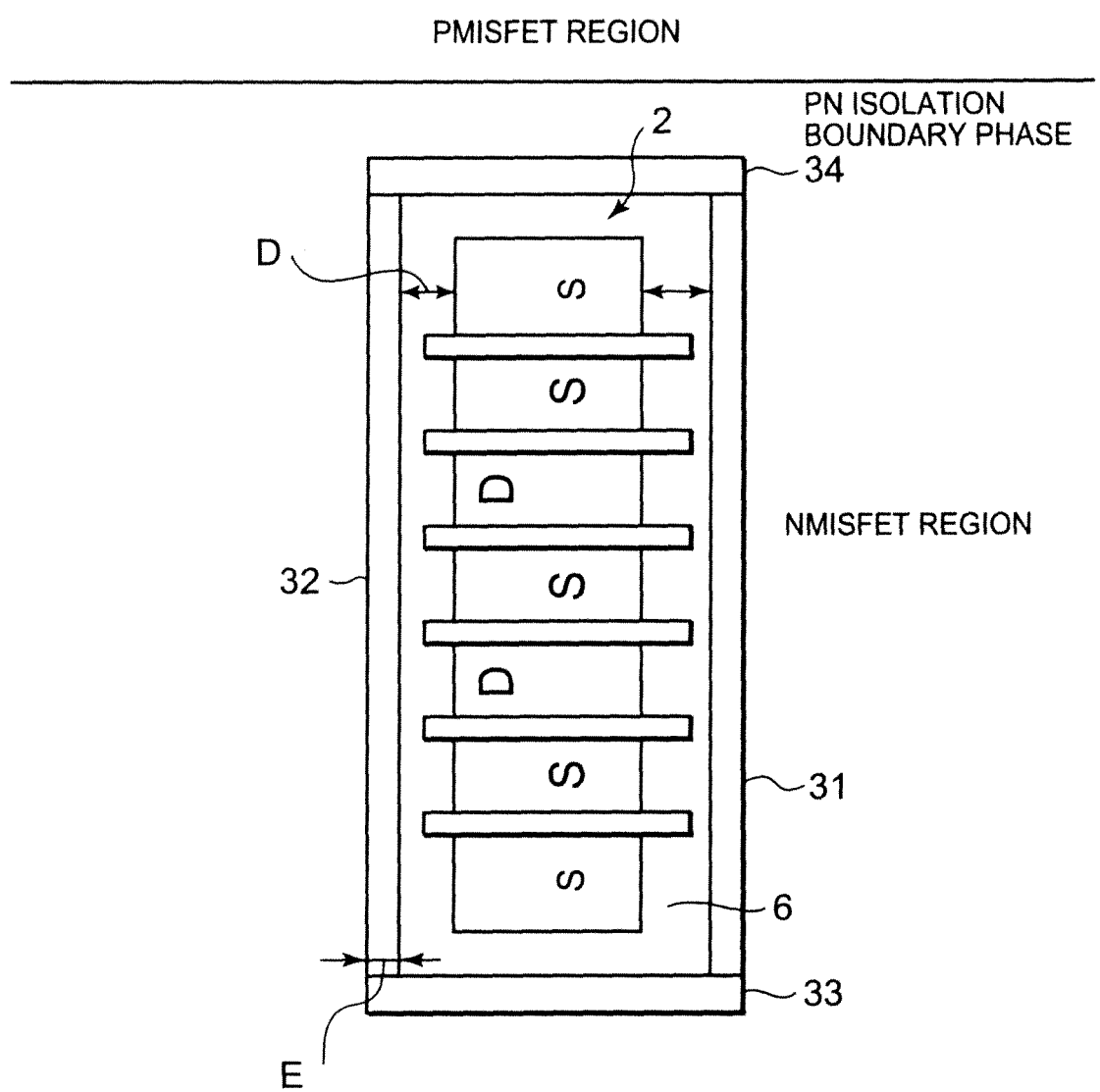
FIG. 15 is a top view of a semiconductor integrated circuit 1 according to a sixth exemplary embodiment.

FIG. 15 is a top view of the semiconductor integrated circuit 1 according to a sixth exemplary embodiment.

The semiconductor integrated circuit 1 includes an MISFET in which the gate electrode is disposed in parallel to the PN isolation surface. Although it depends on the layout of the functional circuit block, the gate electrode of the MISFET is disposed in parallel to the PN isolation face in some cases.

As shown in FIG. 15, the NMISFET is laid out so that the gate electrode is disposed in parallel to the PN isolation face. Thus the charge collecting N-type diffusion layer is disposed at the side of the element isolation surface of the drain diffusion layer in a direction orthogonal to the PN isolation surface. Furthermore, a P-type diffusion layer (GND voltage) is provided in parallel to the PN isolation surface.

The semiconductor integrated circuit 1 is provided with a P-type diffusion layer (GND voltage) near the PN isolation surface, thereby occurrence of the latch-up phenomenon can be prevented. Because the drain diffusion layer is surrounded by both right left side charge collecting N-type diffusion layers by a source/dummy diffusion layer provided vertically, charge collecting into the drain diffusion layer can be suppressed.

The value "D" in FIG. 15 is slightly larger than the gate protrusion margin. Further, the width "E" in FIG. 15 should be wider, but it is just required to be approximately the same as the width of the source diffusion layer. The width should be secured as wide as possible within the limits of the area allowed.

Seventh Exemplary Embodiment

Figure 16:
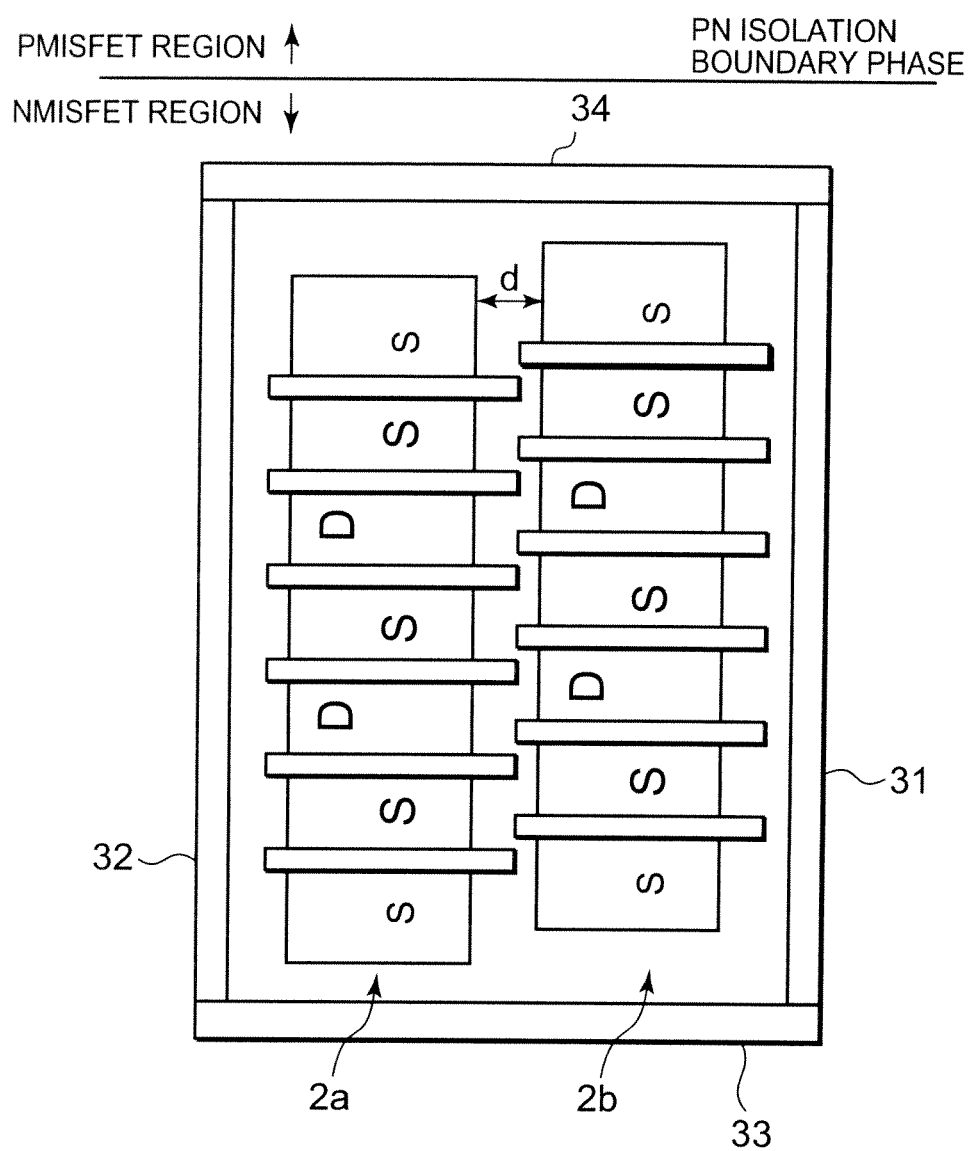
FIG. 16 is a top view (of a semiconductor integrated circuit 1) according to a seventh exemplary embodiment.

FIG. 16 is a top view of the semiconductor integrated circuit 1 according to a seventh exemplary embodiment. In the seventh exemplary embodiment, the semiconductor integrated circuit 1 includes multilayered MISFETs. As shown in FIG. 16, the diffusion layers of adjacent MISFETs are disposed closely to each other, thereby charge are distributed into those diffusion layers. The circuit 1 includes a first charge collecting diffusion layer 31, a second charge collecting diffusion layer 32, a first latch-up suppressing diffusion layer 33 and a second latch-up suppressing diffusion layer 34. The drains of adjacent MISFETs should preferably use different voltages respectively. Those adjacent MISFETs should preferably be independent circuits, respectively.

Eighth Exemplary Embodiment

Figure 17:
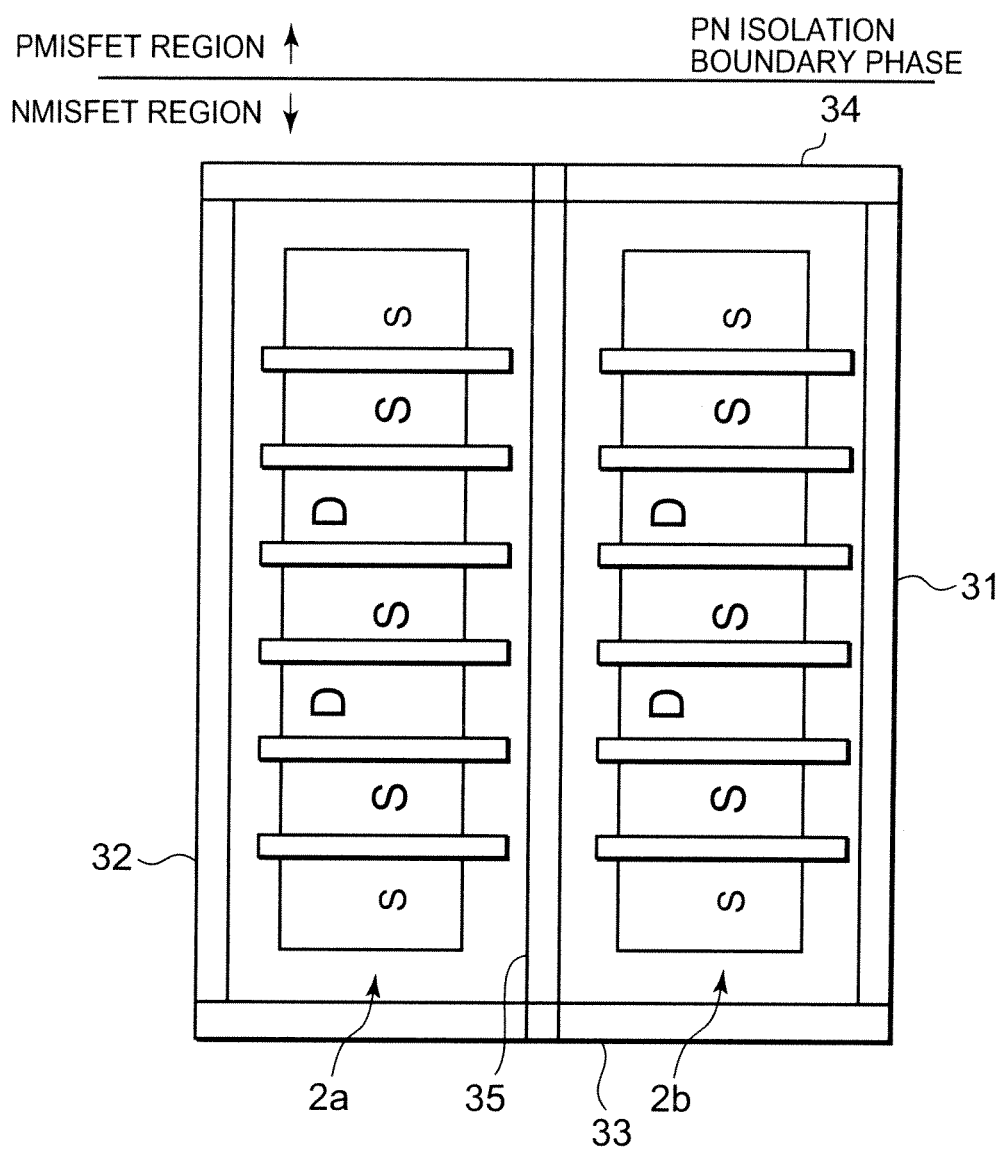
FIG. 17 is a top view of a semiconductor integrated circuit 1 according to an eighth exemplary embodiment.

FIG. 17 is a top view of the semiconductor integrated circuit 1 according to an eighth exemplary embodiment. In the semiconductor integrated circuit 1 in this eighth exemplary embodiment, adjacent MISFETs can be configured regardless of whether or not they use the same circuit contact. The circuit 1 further includes a third charge collecting diffusion layer 35. The third charge collecting diffusion layer may be N-type. In the above exemplary embodiments, the diffusion layers of the MISFETs are laid out in two layers, but the same concept can also apply to three or more diffusion layers formed in those MISFETs.

Ninth Exemplary Embodiment

Figure 18:
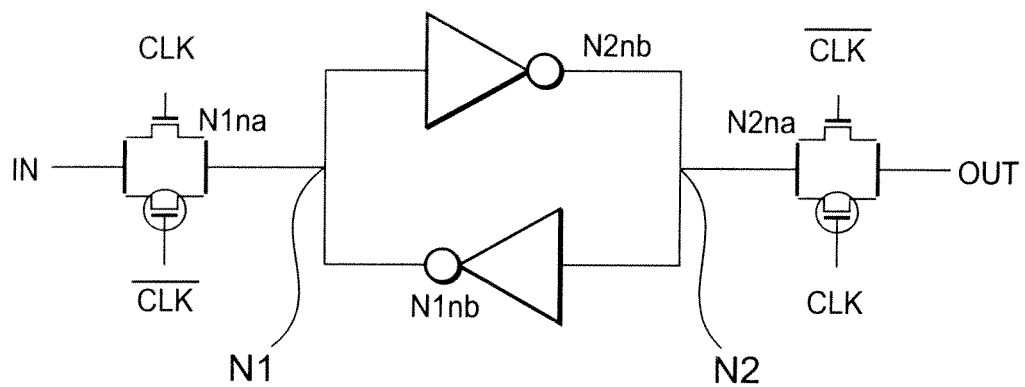
FIG. 18 is a circuit diagram of a latch circuit according to a ninth exemplary embodiment.
Figure 19A:
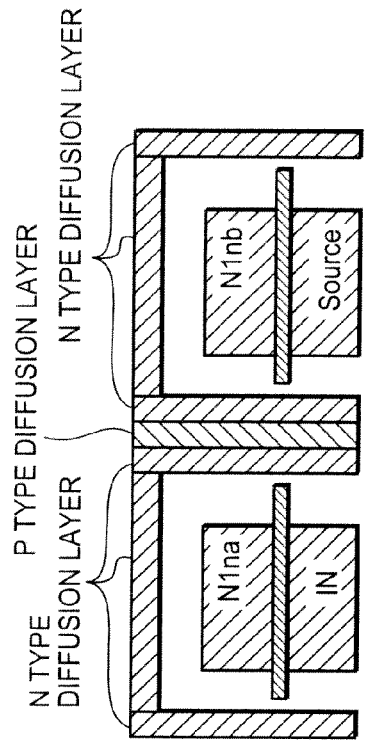
FIGS. 19A-19D illustrate layouts of a node diffusion layer of the latch circuit according to the ninth exemplary embodiment.
Figure 19B:
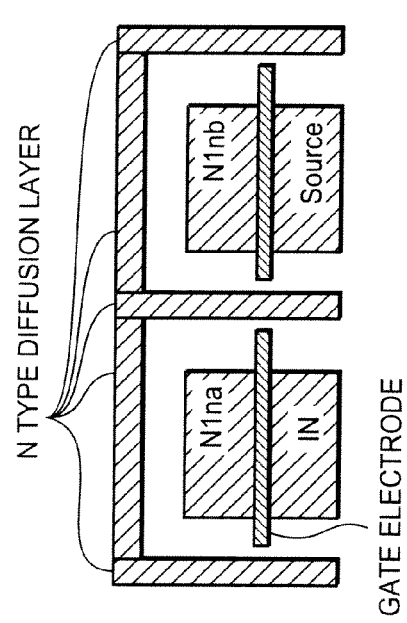
Figure 19C:
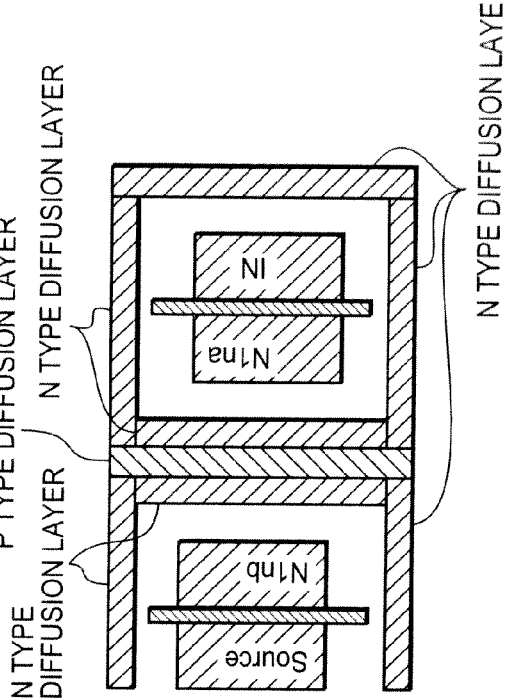
Figure 19D:
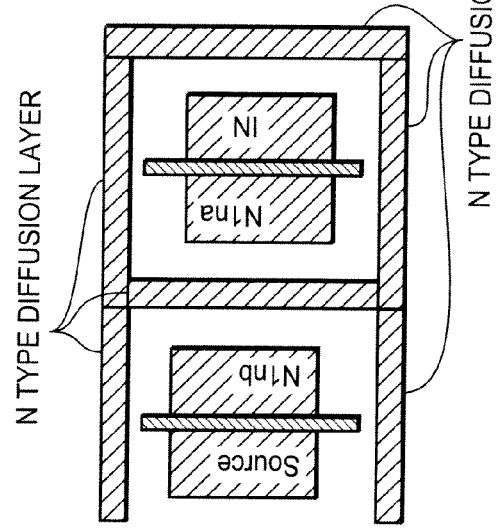

FIG. 18 is a schematic circuit diagram of a latch circuit according to a ninth exemplary embodiment.

The latch circuit includes a flip-flop circuit connected between a node N1 and a node N2. The flip-flop circuit includes two inverters. The latch circuit includes a CMOS transfer gate connected between the node N1 and an input node IN, and a CMOS transfer gate connected between the node N2 and an output node OUT. Each of nodes N1 and N2 includes diffusion layers for two NMOSFET (NMISFET) and diffusion layers for two PMOSFET (PMISFET) as shown by FIG. 18.

FIG. 19 illustrates a layout of a node diffusion layer of the latch circuit according to the ninth exemplary embodiment. In particular, FIG. 19 shows a layout of the diffusion layers of the two NMISFET at the node N1. A diffusion layer IN in FIG. 19A corresponds to a terminal IN of the NMISFET in FIG. 18, a diffusion layer N1na in FIG. 19A corresponds to a terminal N1na of the NMISFET in FIG. 18, and a diffusion layer N1nb in FIG. 19A corresponds to a terminal N1nb of the NISFET constituting the inverter in FIG. 18. As shown in FIG. 19A, the diffusion layers N1na, N1nb are arranged along a direction where electrodes extends, and a N conductivity type diffusion layer is provided between the diffusion layers N1na, N1nb. The N type diffusion layer may be provided with a power source potential or a ground potential. As shown in FIG. 19B, a two N type diffusion layers and a P conductivity type diffusion layer are provided between the diffusion layers N1na, N1nb. The layout of the diffusion layers N1na, N1nb of FIG. 19B are same as the layout of the diffusion layers N1na, N1nb of FIG. 19A. The layout of FIG. 19B has an advantage more than the layout of FIG. 10A because the layout of FIG. 19B can more effectively suppress a parasitic bipolar operation or a latch-up operation, compared with the layout of FIG. 19A. Though no details are explained, two PMISFET at N1 also has substantially same structure and the same effect. FIGS. 19C and 19D illustrates layouts at the node N1. As shown in FIGS. 19C and 19D, the diffusion layers N1nb, N1na are arranged so that the gate electrodes extends in parallel with a direction where a N type diffusion layer provided between the diffusion layers N1nb, N1na extends. As described by FIGS. 19A to 19D, it is preferable to provide the N type diffusion layer between nodes diffusion layers.

In any of the exemplary embodiments described above, in a silicide (salicide) process, an N-type diffusion layer is connected directly to a P-type diffusion layer in the silicide layer. In order to reduce the layout area, the N-type diffusion layer and the P-type diffusion layer should preferably be in contact with each other. However, even when the P-type diffusion layer and the source N-type diffusion layer are separated from each other, the effect of the present invention can be assured.

As described above, the exemplary embodiments can suppress charge collecting into the target (drain) diffusion layer even in standardized mask patterns of miniaturized MISFET elements respectively. Because a source diffusion layer and a dummy diffusion layer are used as charge collecting diffusion layers, the layout area comes to increase. The disposition of the P-type diffusion layer is also effective to suppress occurrence of the latch-up phenomenon.

Furthermore, each charge collecting diffusion layer is disposed at the shortest distance from the drain diffusion layer of the MISFET by taking consideration to the diffusion layer— gate protrusion margin or the margin for forming a contact between the gate electrode and the upper layer wiring, thereby the increase of the layout area is prevented and charge collecting into the target diffusion layer can be minimized.

Furthermore, the MISFET configured according to the exemplary embodiments can apply to any logic circuits. Particularly, the MISFET may be employed for such information holding circuits as F/F circuits, latch circuits, etc., as well as for such circuits that keep transmission signals as internal signal generation/control circuits that include PLL circuits.

Further, it is noted that Applicant's intent is to encompass equivalents of all claim elements, even if amended later during prosecution.

What is claimed is:

1. A semiconductor integrated circuit device, comprising:
a gate electrode of at least one of a P-channel MISFET (metal-insulator-semiconductor field-effect transistor) and an N-channel MISFET provided in a direction parallel to a direction of a well isolation boundary phase between the P-channel MISFET and the N-channel MISFET;
a first diffusion layer having a same conductivity type as that of a drain diffusion layer of one of a plurality of ones of a MISFET provided with a drain diffusion layer of the MISFET therebetween through an isolation respectively in a direction orthogonal to the gate electrode; and
a second diffusion layer having a conductivity type different from that of the drain diffusion layer of the one of the plurality of ones of the MISFET provided between the well isolation boundary phase and one of a source diffusion layer and the drain diffusion layer of the one of the plurality of ones of the MISFET through an isolation, respectively,
wherein the MISFET comprises a drain diffusion layer, a source diffusion layer, a dummy gate electrode, and a dummy diffusion layer, and
wherein the source diffusion layer, the dummy gate electrode, and the dummy diffusion layer are arranged in that order in at least one region.

2. The semiconductor integrated circuit device according to claim 1, wherein the MISFET comprises an element of a latch circuit.

3. The semiconductor integrated circuit device according to claim 1, wherein the first diffusion layer is supplied with a predetermined voltage.

4. The semiconductor integrated circuit device according to claim 1, wherein the dummy diffusion layer is provided across the isolation from the second diffusion layer.

5. The semiconductor integrated circuit device according to claim 1, further comprising a third diffusion layer having a same conductivity type as that of the second diffusion layer, wherein the third diffusion layer faces the second diffusion layer across the MISFET, and the MISFET includes an additional dummy diffusion layer provided across the isolation from the third diffusion layer.

6. A semiconductor integrated circuit device, comprising:
first and second transistor units provided adjacent to each other in parallel to a well isolation boundary between a P-channel MISFET and an N-channel MISFET (metal-insulator-semiconductor field-effect transistor), the well isolation boundary being parallel to a first direction;
first and second diffusion layers extending in a second direction orthogonal to the first direction, and facing each other across the first and second transistor units; and
third and fourth diffusion layers extending in the first direction and facing each other across the first and second transistor units,
wherein each of the first and second transistor units comprises:
a plurality of gate electrodes of a MISFET extending in parallel to the first direction, respectively, the first direction being parallel to the well isolation boundary, the gate electrodes being provided in a second direction orthogonal to the first direction;
a dummy gate electrode provided adjacent to a source diffusion layer of the MISFET;
a dummy diffusion layer provided between the dummy gate electrode and an isolation,
wherein each of the first and second diffusion layers comprises a first conductivity type that is the same as that of a drain diffusion layer of the MISFET, and is provided across the isolation from the drain diffusion layer, and
wherein each of the third and fourth diffusion layers comprises a second conductivity type that is different from the first conductivity type, and is provided between the well isolation boundary and the dummy diffusion layer through the isolation.

7. The semiconductor integrated circuit device according to claim 6, further comprising a fifth diffusion layer having the first conductivity type and extending in the second direction between the first and second transistor units.

* * * * *